United States Patent [19]

Park

[11] Patent Number: 5,040,134
[45] Date of Patent: Aug. 13, 1991

[54] NEURAL NETWORK EMPLOYING LEVELED SUMMING SCHEME WITH BLOCKED ARRAY

[75] Inventor: Chin S. Park, Sunnyvale, Calif.

[73] Assignee: Intel Corporation, Santa Clara, Calif.

[21] Appl. No.: 357,411

[22] Filed: May 26, 1989

[51] Int. Cl.⁵ .................. G06J 1/00; G11C 15/04
[52] U.S. Cl. ............................. 364/602; 307/201;
364/513; 365/49; 365/185; 382/30; 382/33
[58] Field of Search ............... 364/807, 819, 820, 602,
364/604, 513; 365/49, 185; 307/201; 382/14,
15, 30, 33, 35

[56] References Cited

U.S. PATENT DOCUMENTS

| | | | |
|---|---|---|---|
| 4,090,174 | 5/1978 | Van Voorhis | 340/146.3 MA |
| 4,660,166 | 4/1987 | Hopfield | 364/807 |
| 4,760,437 | 7/1988 | Denker et al. | 357/30 |
| 4,773,024 | 9/1988 | Faggin et al. | 364/513 |
| 4,782,460 | 11/1988 | Spencer | 364/807 |
| 4,796,199 | 1/1989 | Hammerstrom et al. | 364/513 |
| 4,802,103 | 1/1989 | Faggin et al. | 364/513 |

FOREIGN PATENT DOCUMENTS

8703411A1 of 0000 PCT Int'l Appl. .
1488935 10/1977 United Kingdom .
2220289A 1/1990 United Kingdom .

OTHER PUBLICATIONS

Lippman, R., "An Introduction to Computing with Newal Nets", IEEE ASSP Magazine, Apr. 1987, pp. 4–22.
Raffel, J., "Electronic Implementation of Neuromorphic Systems", Proc. IEEE 1988 Custom Integrated Circuits Conf., Rochester, N.Y., May 16-19,1988, paper no. 10.1.
"A Pipelined Associative Memory Implemented in VLSI", by Clark et al., IEEE Journal of Solid State Circuits, vol. 24, No. 1, pp. 28–34; Feb. 1989.

Primary Examiner—Stephen M. Baker
Attorney, Agent, or Firm—Blakely, Sokoloff, Taylor & Zafman

[57] ABSTRACT

A novel associative network architecture is described in which a neural network is subdivided into a plurality of smaller blocks. Each block comprises an array of pattern matching cells which is used for calculating the relative match, or Hamming distance, between an input pattern and a stored weight pattern. The cells are arranged in columns along one or more local summing lines. The total current flowing along the local summing lines for a given block corresponds to the match for that block. Each of the blocks are coupled together using a plurality of global summing lines. The global summing lines sum the individual current contributions from the local summing lines of each associated block. Coupling between the local column lines and the global summing lines is achieved by using a specialized coupling device which permits control of the coupling ratio between the lines. By selectively turning on or off various blocks a measure of the match for individual blocks or for groups of blocks representing a subset of the network, may be calculated. Control over the coupling ratio within the blocks also prevents destructive levels of current from building up on the global summing lines.

14 Claims, 5 Drawing Sheets

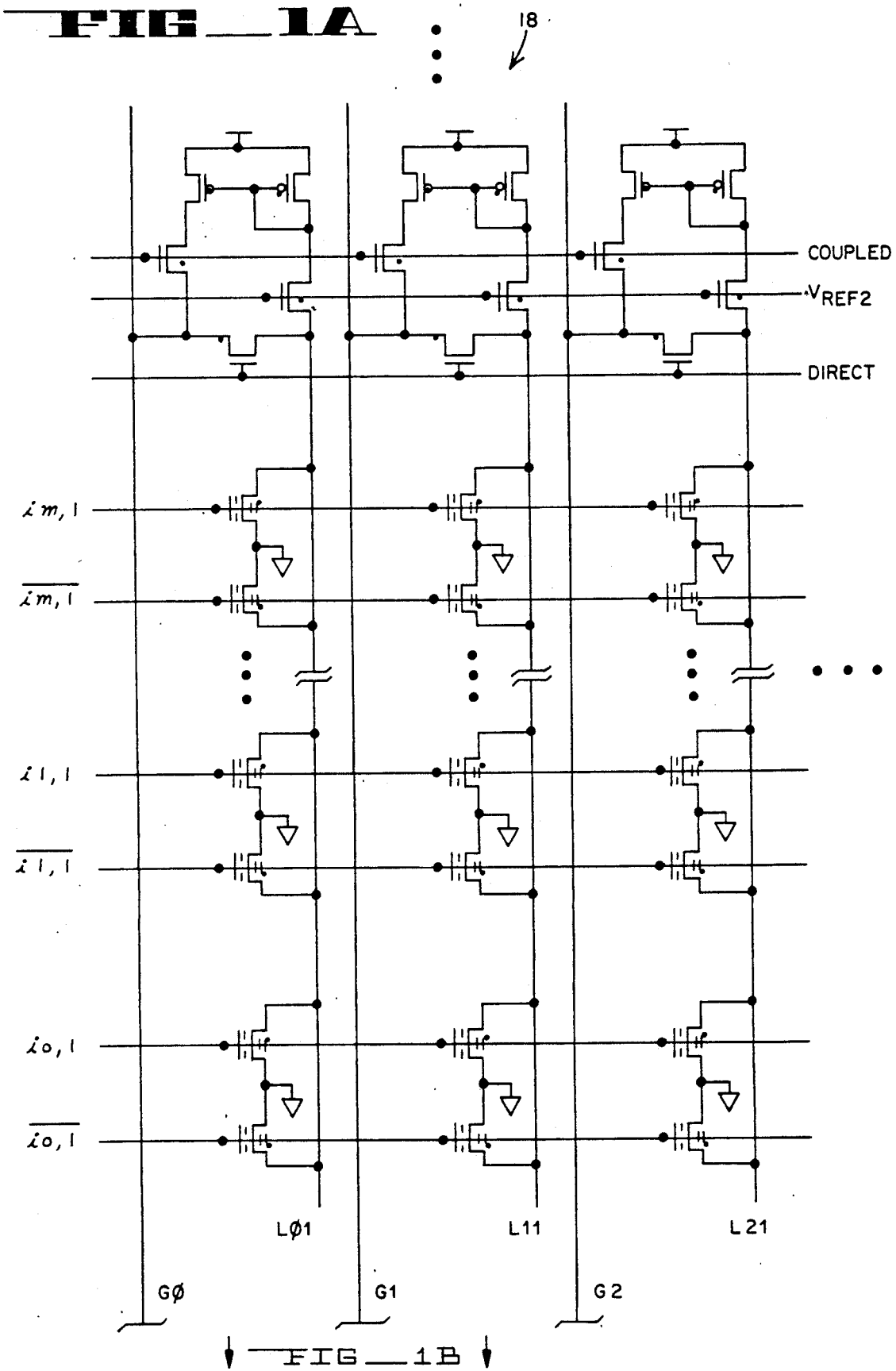
FIG_1A

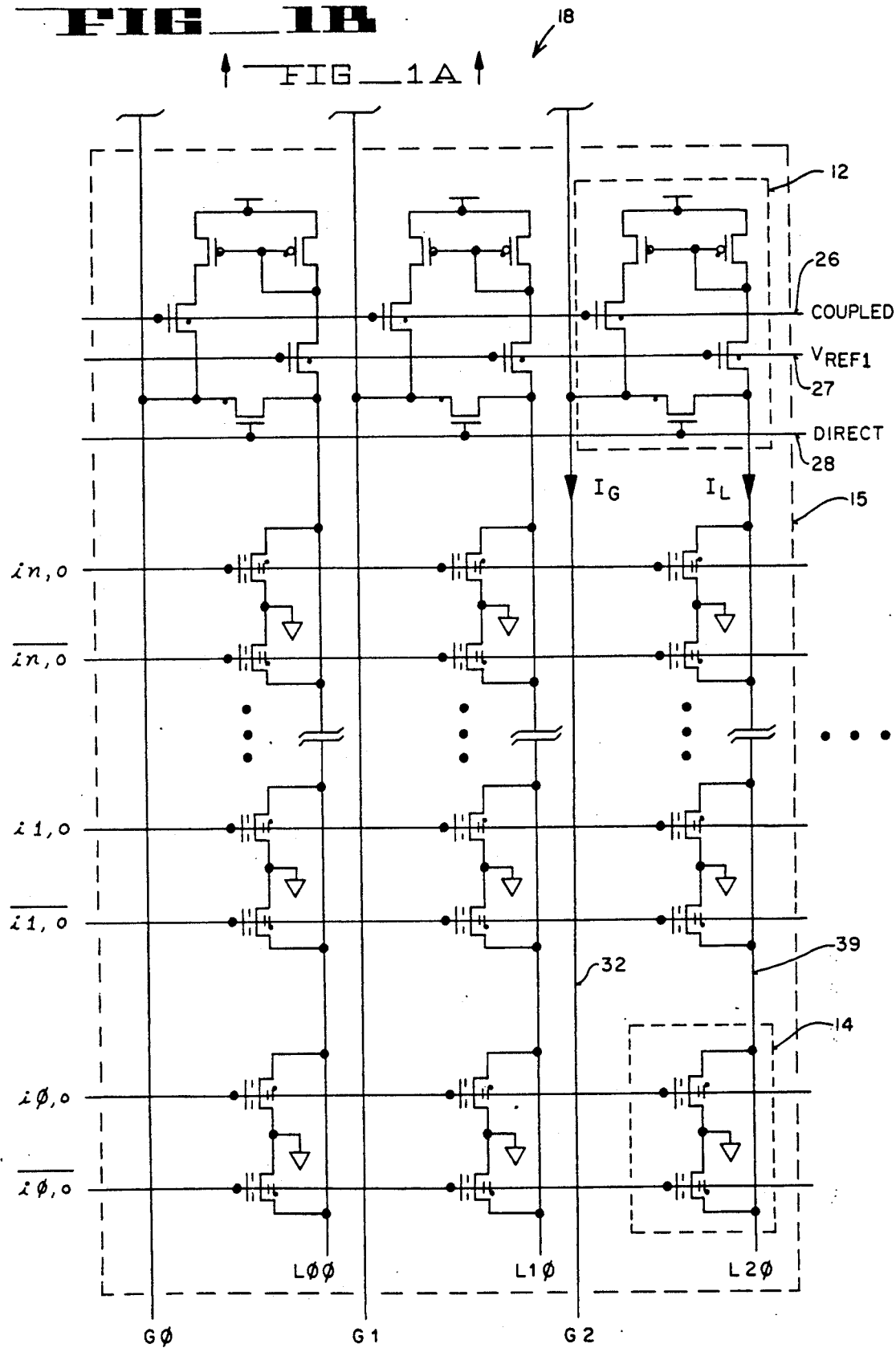

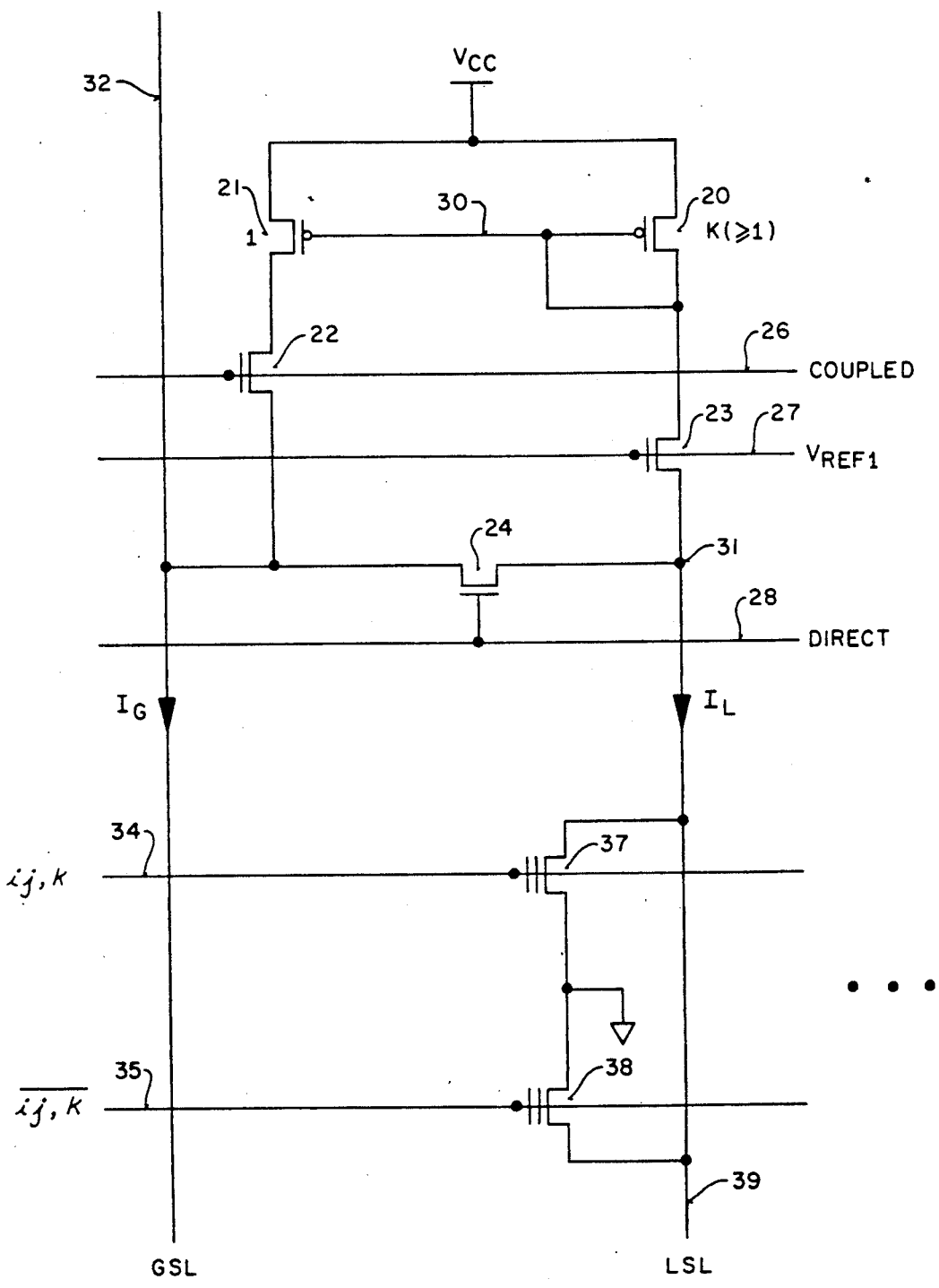

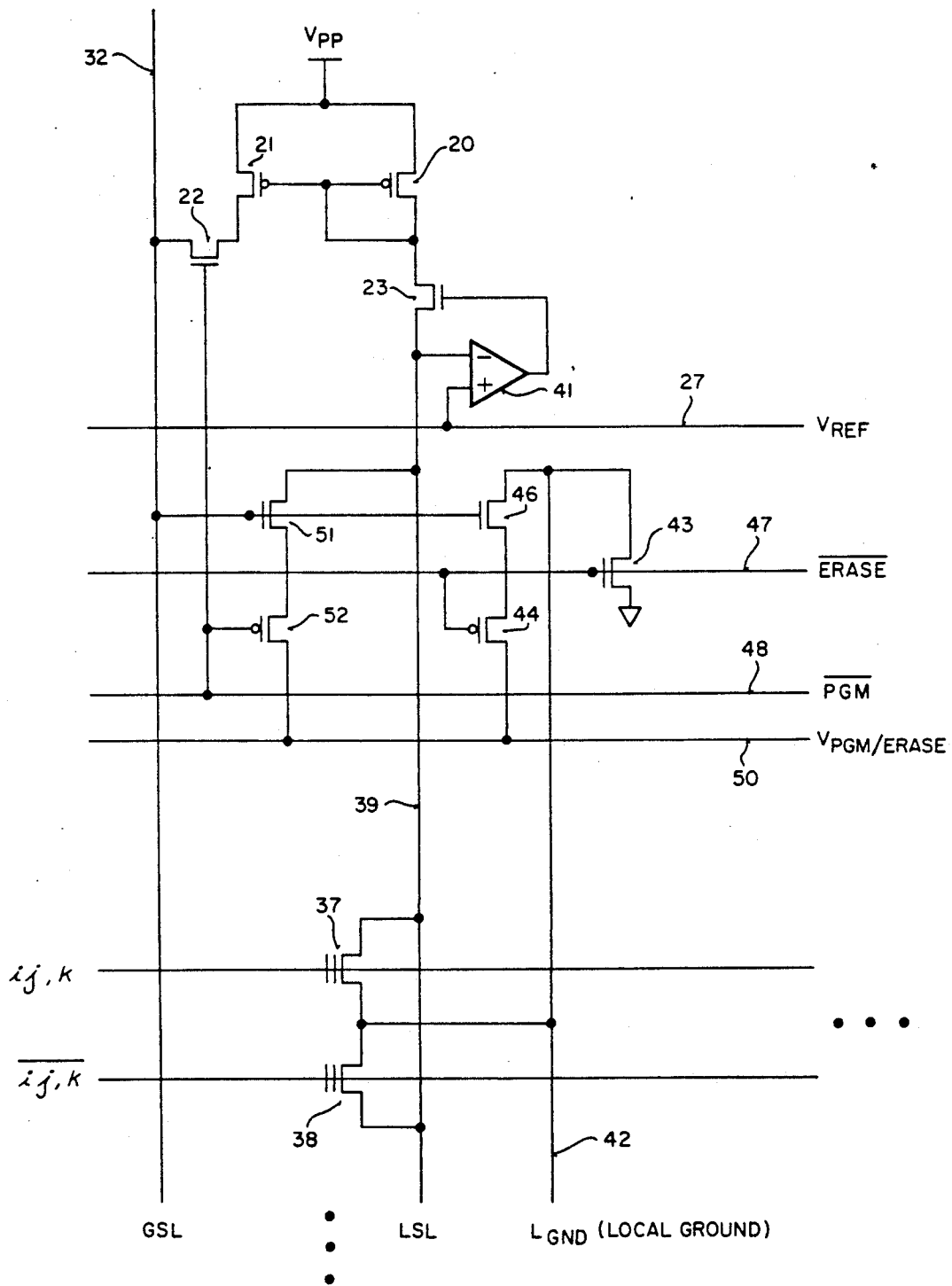
FIG_4

FIG_3
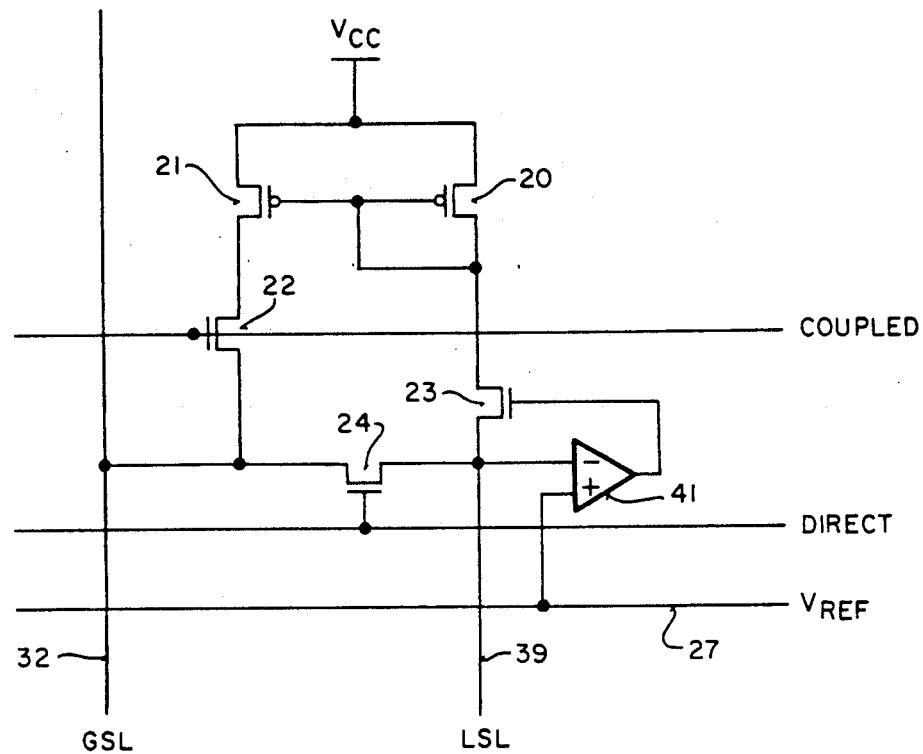
FIG_5
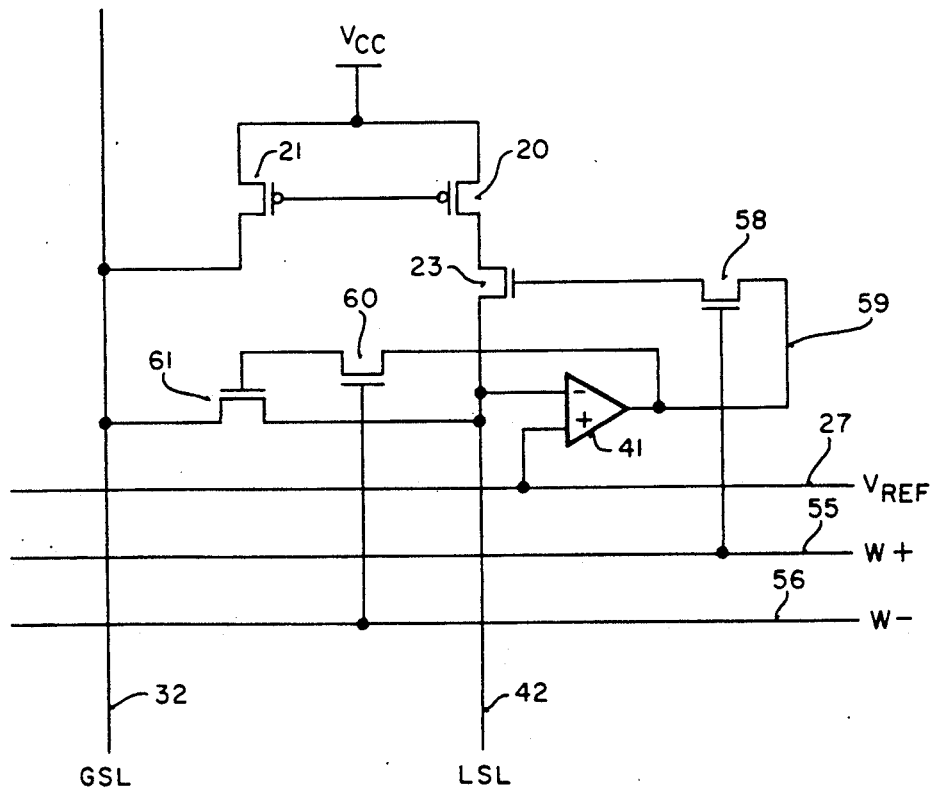

NEURAL NETWORK EMPLOYING LEVELED SUMMING SCHEME WITH BLOCKED ARRAY

FIELD OF THE INVENTION

The invention relates to the field of neural networks, particularly those networks useful in performing pattern matching and Hamming distance calculations.

BACKGROUND OF THE INVENTION

In the past several years, electronics researchers working in the field of analog neural networks and associative memories have attempted to duplicate the logic performed by the human brain. Circuit models have been proposed which provide for both learning (e.g., a programming mode) and decision-making (e.g., recognition, associative memory, etc.).

One category of tasks that neural networks are particularly useful in performing are recognition tasks. That is, neural networks may be utilized to analyze data and identify which features are present. This involves matching templates and expected features to the data and finding the best fit. In pattern matching problems the same stored patterns are repeatedly compared to different input patterns using the same calculation. Various measures of the relative match between the patterns may then be computed.

One measure of the difference between two binary patterns is referred to as the "Hamming distance". (A binary pattern or binary vector is defined in this application to be a string of 1's and 0's, i.e., bits in which the sequence of the bits is meaningful.) Mathematically, the Hamming distance between two patterns is the number of the bits which are different in the two patterns in corresponding bit positions. Of course, both patterns must have the same number of bits for the Hamming distance to have any real meaning, as this provides one-to-one correspondence between bit positions. A semiconductor cell useful in performing pattern matching in a neural network is disclosed in co-pending application entitled "EXCLUSIVE-OR Cell For Pattern Matching Employing Floating Gate Devices", Ser. No. 325,380, filed Mar. 17, 1989 and assigned to the assignee of the present invention; which application is herein incorporated by reference.

Implementing large neural networks in VLSI architecture presents several technical problems which do not normally arise in smaller circuit configurations. By way of example, in an ordinary memory product, only a portion of the array (corresponding to a specific address, i.e., one cell per output bit) is active during a read cycle. In other words, the output is entirely digital in nature and does not depend on the sum of the output currents of each of the cells within the array. Conversely, a neural network may have all of the cells in its entire array active at the same time, providing a large total output current.

As described in the above-referenced application, each neural network matching cell (e.g., EXCLUSIVE-OR cell) may produce a current which is typically summed in an analog manner along one or more column lines. These column lines must be capable of handling very small currents (when none of the cells contribute current) as well as very large currents (for situations in which many or all of the cells are contributing current).

Very large column currents can lead to electromigration of the metal which is used to fabricate the column lines within the array. Electromigration is a leading cause of reliability-type failures. If an attempt is made to lower the read current along the current summing lines, signal interference (i.e., noise) may degrade the accuracy of the computation. The amount of current that any active cell may contribute to the total column current, of course, depends on the programming (i.e., learning) state, as well as the input vector applied.

Since relatively high current can flow on each summing line for a large array, ohmic voltage drop and electromigration presents a serious problem for very large neural network arrays. (The former generates signal interference which degrades the accuracy of the computation while the later gives rise to reliability problems).

As will be seen, the present invention solves these problems by use of a novel neural network architecture. According to the present invention, a neural network is subdivided into a number of smaller blocks. Each block comprises an array of pattern matching cells such as those described in the above-mentioned co-pending application. The cells are arranged in columns along one or more local current summing lines. These lines provide a means of adding together the current contributions from each cell to produce a measure of the relative match between a binary input pattern applied to the block and a binary weight pattern stored within the cells of the array.

In addition, each column line within a block is coupled to a global summing line through a specialized coupling network. The global summing lines add the associated local column currents to produce a measure of the Hamming distance for a plurality of blocks. The type of architecture described in this application is referred to as a leveled summing scheme with blocked array (LSBA) and provides an elegant solution to the problem of large neural network implementation.

Other prior art known to applicant which is believed pertinent to this application includes U.S. Pat. No. 4,760,437 of Denker et al.; U.S. Pat. No. 4,660,166 of Hopfield; U.S. Pat. No. 4,782,460 of Spencer; U.S. Pat. No. 4,773,024 of Faggin et al.; U.S. Pat. No. 4,802,103 of Faggin et al.; and "A Pipelined Associative Memory Implemented In VLSI" by Clark et al., *IEEE Journal of Solid State Circuits*, Vol. 24 No. 1, pp. 28-34, February 1989.

SUMMARY OF THE INVENTION

In accordance with the teachings of the invention, there is provided an associative network which comprises a plurality of circuit blocks, each of the blocks itself comprising a plurality of semiconductor cells arranged so as to form an array for computing the relative match between an applied input pattern and a stored weight pattern.

In the operation of the new network architecture, the semiconductor cells may contribute current to a plurality of local summing lines located within each of the blocks. These local summing lines are used for summing the individual current contributions from the cells. The total current, representing the sum of the individual local column currents flowing within a block, corresponds directly to the match between the two patterns.

Additionally, each of the blocks within the network are coupled together along an associated plurality of global summing lines. The global summing lines are coupled to an associated one of the local summing lines via a coupling device. The coupling device allows the currents from each of the local column lines associated with several blocks to be summed along an individual global summing line. The collective global current which is obtained corresponds to the total match between all of the input patterns and all of the stored weights for the entire network.

In a preferred embodiment, each of the coupling devices are controllable so that each block within the network may be assigned a weight. In other words, the connection strength between the local and the global summing lines may be dynamically altered on a block-by-block basis, thereby providing precise control over the magnitude of the global currents as well as the computation process in general.

BRIEF DESCRIPTION OF THE DRAWINGS

The present invention will be understood more fully from the detailed description given below and from the accompanying drawings of the preferred embodiment(s) of the invention which, however, should not be taken to limit the invention to the specific embodiment(s) but are for explanation and for understanding only.

FIG. 1A shows a first portion of the currently preferred embodiment of the present invention.

FIG. 1B shows a second portion of the currently preferred embodiment of the present invention.

FIG. 2 illustrates a subsection of the network of FIGS. 1A and 1B, and shows in detail the coupling network which is utilized to couple individual local summing lines to their associated global summing lines.

FIG. 3 is an alternative embodiment of the coupling network presented in FIGS. 1 and 2.

FIG. 4 is another alternative embodiment of the coupling network shown in FIGS. 1–3.

FIG. 5 is yet another alternative embodiment of the coupling network illustrated in FIGS. 1–4.

DESCRIPTION OF THE PREFERRED EMBODIMENT(S)

A neural network employing a leveled summing scheme with a blocked array (LSBA) architecture is described. In the following description, numerous specific details are set forth such as specific cell structure, circuit configurations, etc., in order to provide a thorough understanding of the present invention. It will be obvious, however, to one skilled in the art that the present invention may be practiced without these specific details. In other instances, well-known circuits are not set forth in detail so that the present invention is not unnecessarily obscured.

With reference to FIGS. 1A and 1B, the LSBA architecture of the present invention is shown. Neural network 18 comprises a two-dimensional matrix of array blocks, such as block 15. Each block has associated with it a plurality of input lines for coupling input voltage vectors to an array of pattern matching semiconductor cells such as EXCLUSIVE-OR cell 14. The individual cells within a given block are responsible for computing the relative match between a bit of an input vector pattern and a bit of a stored weight pattern.

Cell 14 preferably comprises a pair of floating gate devices having their drains coupled to a local summing line (e.g., $L_{20}$ in FIG. 1B), and their sources grounded. The operation and programming of cell 14 is described in detail in Applicant's co-pending application Ser. No. 325,380 (see Background of the Invention). Depending on the voltage inputs present on lines $i_{0,0}$ and $\overline{i_{0,0}}$ and the internal status of the device (e.g., programmed or erased), cell 14 may contribute to the current $I_L$ flowing along local summing line 39 in block 15. The current $I_L$ flowing in each local summing line depends on the sum of the individual current contributions from the EXCLUSIVE-OR cells associated with that line.

Also present within block 15 is a plurality of coupling networks, such as network 12, which couple individual local summing lines (e.g., $L_{20}$) to their associated global summing lines, (e.g., $G_2$) within network 18. Coupling network 12 also includes lines 26, 27, 28, labeled "Coupled", "$V_{REF1}$", and "Direct", respectively. These lines provide control over individual blocks in terms of their relative contribution to the global current (e.g., $I_G$) flowing in network 18. This aspect of the present invention will be discussed in more detail later.

The current $I_G$ represents the sum of the local column currents associated with a global summing line across several blocks in network 18. In FIGS. 1A and 1B, for example, line 32 (i.e., $G_2$) may sum the currents flowing down lines $L_{20}, L_{21}, \ldots, L_{2N}$.

Each local summing line within array 18 has associated with it a separate coupling network 12. The total current for all of the global summing lines $G_0-G_K$ corresponds to the Hamming distance between an input vector $i_{j,k}$ and a stored weight pattern (the stored weight pattern being programmed on the floating gates of the individual cells) for the entire network 18. As will be discussed in more detail later, one of the important features of the present invention is the ability to dynamically alter block weights and measure the Hamming distance on a block-by-block basis.

Referring now to FIG. 2, coupling network 12 is shown along with an EXCLUSIVE-OR cell, global summing line 32 and local summing line 39. Floating gate transistors 37 and 38 comprise the EXCLUSIVE-OR cell coupled to local summing line 39. Most often, these devices employ polysilicon floating gates which are completely surrounded by insulation (e.g., silicon dioxide). Charge is transferred onto these floating gates through a variety of mechanisms such as avalanche injection, channel injection, tunnelling, etc. The charge of the floating gate affects the conductivity in the device. If the conductivity is above a certain level, the device is deemed to be programmed in one binary state. If the conductivity is below another level it is deemed to be programmed in another binary state.

In FIG. 2, devices 37 and 38 have their drain regions coupled to local summing line 39 while their sources remain grounded. The control gate of device 37 is coupled directly to the voltage input line 34, labeled $i_{j,k}$. The control gate of floating gate device 38 is similarly coupled to voltage input $\overline{i_{j,k}}$ along line 35.

A digital weight pattern is stored in the EXCLUSIVE-OR cell of FIG. 2 by programming (i.e., charging) one floating gate device to a predetermined level while erasing (i.e., removing charge) the other device. Depending on the stored weight pattern and the applied input voltage, one of the floating gate devices in the EXCLUSIVE-OR cell may conduct current. Current flow generally results when a match between the input vector and the stored weight pattern is detected. When either device 37 or 38 conducts, the current contributes to the total current $I_L$ flowing down line 39. Thus, if every one of the EXCLUSIVE-OR cells coupled to line 39 is conducting current the magnitude of $I_L$ will be large. On the other hand, if none of the EXCLUSIVE- OR cells coupled to line 39 are conducting, the total local summing line current, $I_L$ will be quite small (equal only to the read bias current).

During a read operation of network 18, one or more of the blocks is sampled to compute the match, or Hamming distance, for those blocks. This process involves coupling the currents $I_L$, flowing down the local summing lines, to a global summing line to produce a global current $I_G$. The current $I_G$ corresponds to the match between the binary patterns associated with each block contributing current to that global summing line. Note that there is a global summing line associated with each column of local summing lines within the network. Because each block may have one or more local summing lines, the number of global summing lines is always equal to the number of columns arranged in network 18. It is possible to have a block which comprises only a single column and, therefore, single local and global summing lines associated with that column.

In FIG. 2, the coupling network coupling local summing line 39 to global summing line 32 includes field-effect devices 20-24. As arranged, these transistors comprise a standard current mirror with additional control features. In the preferred embodiment, field-effect devices 20 and 21 comprise ordinary p-channel devices fabricated using a complementary metal-oxide-semiconductor (CMOS) process. Device 20 and 21 have their sources coupled to $V_{CC}$ (i.e., supply potential) and their gates coupled together and to the drain of device 20 via line 30.

In accordance with the operation of the mirror, the current flowing through transistor 21 is a direct function of the current flowing through transistor 20. In another words, the current flowing through device 21 is directly related to the current $I_L$. When line 26 (labeled "coupled") is raised to a high potential, device 22 allows the current flow through transistor 21 to contribute to the total current $I_G$ flowing on line 32. Line 26 is normally at a high potential during read operations. Thus, the use of the current mirror of coupling network 12 permits contribution of the local summing currents to the associated global summing line current.

It should be understood that the actual magnitude of the current flowing through device 21, and therefore the current which contributes to the global current $I_G$, is a function of the device size ratio of devices 20 and 21. Device 20 is shown with a device size "K", which is greater than 1, while device 21 is shown with a device size of "1" in FIG. 2. This means that local summing line current $I_L$ is reduced by a factor of K when it is coupled to global summing line 32. Thus, the device size ratio K is one way in which the blocks may be "weighted". This, therefore, provides a means for reducing the magnitude of the current $I_G$ within a reasonable range.

It should also be understood that the polarity and magnitude of K can be predefined by hardware, programmed by floating gate devices or dynamically adapted through random-access memory (RAM) or similar charge holding devices.

Another way in which block weight may be controlled is by adding field-effect device 23 along with reference voltage line ($V_{REF1}$) 27 to the basic current mirror. Line 27 is coupled to the gate of field-effect device 23 which preferably comprises an ordinary n-channel CMOS transistor. As the potential on line 27 is raised, device 23 conducts more freely, thereby raising the potential at node 31. Raising the voltage at node 31, in turn, causes the magnitude of the current $I_L$ flowing on line 39 to increase also. Thus, the magnitude of the current $I_L$ is directly related to the magnitude of the reference potential $V_{REF1}$, and control of potential $V_{REF1}$ is yet another way of adjusting the block weight. By selectively raising or lowering the reference potentials for various blocks, the user may compute the pattern match for individual blocks or for groups of blocks.

For example, if the user wants to compute the match between an input binary pattern and a stored weight within a block 15—while ignoring all other blocks—the voltage reference line $V_{REF1}$ (see FIG. 1B) is raised to a high potential while simultaneously taking the voltage reference lines for all of the other blocks to ground or a relatively low potential. Grounding the reference line associated with a block has the effect of turning that block off. This prevents any contribution of local current to the global current summing line associated with the column of the block under computation.

Non-identical block weights may also be useful for neural computation of graded inputs such as primary data, secondary data and so on. Using the LSBA architecture, block weight is dynamically adaptable while the weight of the internal cell (e.g., the EXCLUSIVE-OR cell) in the array remains static or nearly static. This feature may be useful in applications where a critical part of input data is localized and dynamically moving.

For instance, the block weight can be made to track—as a positive or negative function—the average intensity of its inputs or those of other blocks. Furthermore, by having the ability to control the polarity of the block weight, inter-block computation, such as addition or subtraction of inner products of vectors (input vector and state vectors stored in the column) can be achieved on a local basis. This feature is useful for applications involving microprocessor controlled neural networks, i.e., block weights and input/output paths controlled by microprocessor.

For real-time dynamic weight applications, random-access memories (RAMs) or other temporary charge storage devices may be utilized in place of the EXCLUSIVE-OR cell 14 of FIGS. 1A and 1B. However, it should be recognized that their application is limited due to the binary nature (e.g., RAM) or finite storage time associated with those devices. Because of the normally long program/erase times, including verification of program state, associated with floating gate devices, use of these floating gate devices (without the coupling network control provided by device 23 and $V_{REF}$) in dynamic weight applications would be limited to those applications operating at reduced speeds. The LSBA architecture of the instant invention provides dynamic block weight capabilities in which the block weight may vary dynamically while the weight of each internal cell remains static. Certainly, changing block weight in the manner described above is much faster than changing the programming state of the floating gate cells in the blocks in a sequential manner.

Recharging and discharging on the floating gate members of devices 37 and 38 may occur in the following manner. Referring again to FIG. 2, for instance, to program device 37 line 39 (connected to the drain region of device 37) and line 34 (connected to the control gate of device 37) are raised to a high positive programming potential of approximately 12 volts. The voltage on line 39 is controlled using device 24, line 28 (labeled "direct"), and global summing line 32. By raising the potential on line 28, field-effect device 24 conducts freely allowing any potential present on line 32 to be transferred to line 39. Because line 32 is easily accessed from the external terminals of network 18, it is easily used as vehicle to facilitate programming of the internal cells of the array. During read operations, line 28 is at a low potential so that field-effect device 24 does not conduct.

Under the conditions described above, a high positive voltage on the control gate of device 37 causes electrons to tunnel through the thin oxide near its drain and be captured by the floating gate. This raises its (programming) threshold. Electrons are removed from the floating gate of device 25 by taking the control gate connected to line 34 to a voltage at or near ground potential. The drain of device 37 is then taken to a high voltage by raising the potential on line 39 as described above. The application of a high bias to the drain of device 37, while its control gate is grounded, causes electrons to tunnel from the floating gate to the drain thereby reducing the (erasing) threshold of device 37.

For neural network 18, the block size and the numbers of inputs and outputs for the block are decided from considerations of cell read current, metal electromigration, chip architecture, physical design, etc. It is often desired to make the cell read current as low as possible for a large array as discussed previously. The lower limit for the read current is determined from considerations of signal resolution, leakage, noise, offset, and the distribution of physical device parameters in each of the pattern matching cells, i.e., the EXCLUSIVE-OR cells. For an EPROM/EEPROM-based array, control of the read current is also limited by the available voltage reference sources and the read drain bias circuitry. For instance, diode voltage drops or MOS transistor threshold voltage changes can occur in response to temperature, supply fluctuation, process, etc.

With continuing reference to FIG. 2, it is obvious that the current mirror of coupling network 12 may be implemented employing only transistors 21 and 20. In other words, transistors 22, 23 and 24 are not essential to the bare function of the current mirror and may be eliminated in certain applications. If necessary, for purposes of providing greater accuracy, a more sophisticated current mirror, such as a Wilson current mirror, may be used. Of course, if transistor 23 and its associated $V_{REF1}$ line is removed then some control over block weight is lost and parasitic programming effects may become significant. Recall that $V_{REF1}$ provides the block weight along with the transistor area ratio K. In FIG. 2, K is a fixed value but $V_{REF1}$ is variable for dynamic block weight applications.

FIG. 3 shows an alternative embodiment for coupling network 12. The circuit of FIG. 3 is the same in all respects to that of FIG. 2 except that the control gate of field effect transistor 23 is coupled to the output of amplifier 41. Amplifier 41 is an ordinary differential amplifier which may be implemented in numerous circuit configurations. The negative input of amplifier 41 is coupled to local summing line 39, while the positive input to amplifier 41 is coupled to $V_{REF}$ line 27. Ordinarily, line 27 extends across the entire block connecting each coupling network in the manner shown in FIG. 3.

In operation, when voltage reference line 27 is raised relative to the voltage present on line 39, amplifier 41 will raise its output voltage in an attempt to drive the negative input voltage, i.e., the voltage on line 39 to the same level as that of its positive input. The alternative embodiment of FIG. 3 has an advantage of providing more accurate control of the block weights when compared to the coupling network of FIG. 2.

As was discussed in conjunction with FIG. 2, transistor 22 may be removed and the source of transistor 21 tied directly to global summing line 32. Leakage sensitive circuits, however, do benefit from the inclusion of device 22 in coupling network 12.

In both FIGS. 2 and 3 when transistor 22 is "on" and transistor 24 is "off", coupling network 12 acts as a current mirror which may be employed for read operations. When both devices 22 and 24 are "off" coupling network is disconnected and the block is inhibited from contributing any current to global summing line 32. Of course, another way of disabling the current mirror is by grounding voltage reference line 27 for any given block. Whenever transistor 24 is in the "on" state, irrespective of the state of device 22, global summing line 22 is directly connected to local summing line 39. Direct coupling of lines 22 and 39 is particularly useful when programming the EXCLUSIVE-OR cells of the array.

Referring now to FIG. 4, another alternative embodiment of coupling network 12 is shown. The circuit of FIG. 4 includes additional local ground line 42 ($L_{GND}$), which couples the sources of the floating gate devices for each EXCLUSIVE-OR cell to the drains of n-channel field-effect devices 46 and 43. The operation of the coupling network of FIG. 4 is as follows.

During read operations the voltage reference $V_{REF}$ present on line 27 is raised to a high bias potential. This activates amplifier 41, turning on transistor 23 and thereby activating the current mirror. $\overline{ERASE}$ line 47 (coupled to the gates of devices 43 and p-channel device 44) is raised to a high positive potential. This turns off device 44 and turns on device 43, thereby connecting a ground potential on line 42 to the array. $\overline{PGM}$ line 48, which is connected to the gates of p-channel device 52 and n-channel device 22, is also high during read operations. This has the effect of turning off device 52 while turning on device 22 to enable local summing line current $I_L$ to contribute to the global summing line current flowing on line 32.

During programming mode, line 27 is grounded to disable the current mirror. $\overline{PGM}$ line 48 is also taken to a low potential (e.g., ground) in order to disable device 22 while turning on device 52. $\overline{ERASE}$ line 47 is then taken to a high positive potential, such as the programming potential $V_{PP}$ (=12 volts). This turns on device 43 which connects the sources of the respective floating gate cells to ground potential. Device 44 is turned off when $\overline{ERASE}$ 47 is high. Also during programming mode, $V_{PGM/ERASE}$ line 50 is connected to a programming drain bias which, in the currently preferred embodiment, may be anywhere between 5 and 8 volts. If global summing line 32 is at a high positive potential, then devices 51 and 52 will be "on" thereby permitting the programming and erase potential present on line 50 to be coupled to local summing line 39. By selectively raising the potential on the input vector lines $i_{j,k}$, each of the floating gate devices such as device 37 and 38 may be programmed in sequence.

Since each of the devices of FIGS. 1–5 are implemented in a CMOS process, it is important to properly bias the wells during programming and erase mode. For n-well CMOS processes, the wells of transistors 21 and 20 are biased to their highest possible voltage ($V_{PP}$ in conventional EPROM/EEPROM products) which can be applied on the GSL and LSL lines.

During erase mode, voltage reference line 27 is grounded to disable the current mirror; $\overline{\text{ERASE}}$ line 47 is taken to a low potential (i.e., ground); $\overline{\text{PGM}}$ line 48 is taken to a high positive potential (e.g., $V_{PP}=12$ volts); and $V_{PGM/ERASE}$ line 50 is connected to a high positive potential (e.g., 12 volts). This has the effect of turning off devices 23, 52 and 43. If global summing line 32 is "high" then devices 46 and 44 will be on, thereby providing connective path for the programming and erase voltage present on line 50 to be coupled to local ground line 42. By this technique, selected columns may be erased.

As would be obvious to an ordinary practitioner in the art, transistor 46 can be optionally replaced by a p-channel transistor to avoid voltage drops across the source/drain region of device 46. In that situation, column selection is performed by taking global summing line 32 to a low potential. Further, if $\overline{\text{ERASE}}$ line 47 is localized, i.e., a separate $\overline{\text{ERASE}}$ line is provided for each block, then erase operations may be localized to a selected column of a selected block.

The primary advantage of the coupling network shown in FIG. 4 over those previously discussed is that the circuit of FIG. 4 reduces disturbance to adjacent blocks during programming/erase operations. Furthermore, the circuitry of FIG. 4 supports local flash erase operations for the selected column of a selected block where low cost flash EEPROMs are utilized in the pattern matching cells. (Currently, conventional EEPROM cells are several times larger in area, and require more complex processing, than flash EEPROM cells.)

Referring now to FIG. 5, another alternative embodiment of the basic coupling network is shown. The circuit of FIG. 5 is particularly useful in implementing a negative block weight. As was the case in FIGS. 2-4, transistors 20 and 21 in FIG. 5 form the basic current mirror. Amplifier 41 and n-channel device 23 provide the drain bias voltage during read operations for local summing line 42. The alternative embodiment of FIG. 5 includes n-channel devices 61 and 60. N-channel device 61 is coupled across global summing line 32 and local summing line 39. The gate of device 61 is coupled to one end of n-channel device 60. The other end of device 60 is coupled to the output of amplifier 41. The gate of device 60 is coupled to line 56 (labeled W−). N-channel device 58 is coupled between the output of device 41 and the gate of device 23. The gate of device 58 is coupled to line 55 (labeled W+). As before, reference line 27, $V_{REF}$, is coupled to the positive input of amplifier 41 and supplies the weight for each block within the neural network.

Assume that line 55 is "high" and line 56 is "low". In this situation device 58 is on, device 60 is off and the block is coupled for read operations as discussed as above, (i.e., positive coupling is assigned to the block). However, if line 55 is "low" and line 56 is "high", then device 60 is on, device 58 is off and the coupling is performed with reversed polarity. Thus, the circuit of FIG. 5 is useful in situations in which the assigned block weight assumes a signed value (still, the magnitude of the weight function can be controlled by the voltage $V_{REF}$).

Note that in FIG. 5 the programming and erase path circuitry has not been shown for clarity reasons. Also, the current mirror is shown with a unity coupling ratio. A unity coupling ratio is reasonable, but not necessary, for matching the polarities. To implement other coupling ratios, i.e., less than one, an additional current mirror is required for the negative weight path.

Whereas many alterations and modifications of the present invention will no doubt become apparent to a person of ordinary skill in the art after having read the foregoing description, it is to be understood that the particular embodiments shown and described by way of illustration are in no way to be intended to be considered limiting. For example, although this disclosure has shown a particular way of implementing an LSBA architecture using EXCLUSIVE-OR matching cells, other implementations using different cells and different arrays may be implemented by using the basic concept presented in this application. Generally, different coupling circuitry may be required for different computational arrays. Therefore, reference to the details of the preferred embodiment are not intended to limit the scope of the claims which themselves recite only those features regarded as essential to the invention.

Thus, an architecture for implementing large scale neural networks has been described.

I claim:

1. An associative network comprising a plurality of blocks, each block comprising a plurality of cells arranged so as to form an array for computing the match between two binary patterns, one of said binary patterns being stored within said cells and the other of said binary patterns being applied as an input to said cells, said cells contributing current to a plurality of local summing lines within each said block, said local summing lines summing the individual current contributions from said cells such that the total local current of each block corresponds to said match;

said network further comprising a plurality of global summing lines and wherein each said block further comprises a plurality of coupling devices, each of said coupling devices comprising first and second field-effect devices coupled so as to form a current mirror wherein the current flow through said first field-effect device is a dependent function of the current flow in said second field-effect device, one coupling device being associated with each of said local summing lines for selectively coupling said local summing lines to a global summing line such that said total local current contributes to the total global current flowing in said global summing lines, said total global current corresponding to the total match between said binary patterns for all of said blocks selected within said network; and means for weighting the coupling strength between said local summing lines within a single block and their associated global summing line independent of all other of said blocks, said weighting means comprising a third field-effect device coupled in series between said second field-effect device and one of said local summing lines, said third field-effect device having a reference potential coupled to its gate such that when said reference potential is applied to each of said coupling devices within said block said block is activated for purposes of computing said match.

2. The network of claim 1, wherein said coupling device further comprises a fourth field-effect device coupled in series between said first field-effect device and said one of said global summing lines, said fourth field-effect device coupling said current mirror to said global summing lines, the gate of said fourth field-effect device being coupled to said weighting means to control said coupling strength.

3. The network of claim 2 further comprising a fifth field-effect device coupled to said programming means for electrically coupling said global summing lines to said local summing lines to facilitate programming of said cells.

4. The network of claim 3, wherein said first and second field-effect devices are p-channel devices.

5. The network of claim 4, wherein said third, fourth and fifth field-effect devices are n-channel devices.

6. As associative network for computing the Hamming distance between two binary patterns, said network comprising a plurality of blocks and a plurality of global column lines, each of said blocks comprising a plurality of semiconductor cells arranged so as to form an array, said array having a plurality of local column lines, each column line being coupled to a separate column of said cells, each cell of said array producing an output current whose value depends on the relative match between a corresponding element of an input voltage vector and a weight pattern stored in said cell, said output current contributing to the local summing current flowing on each of said local column lines, each of said blocks including a means for selectively coupling each of said local column lines to an associated one of said global column lines on a weighted basis such that the connection strength between said local summing lines and said one of said global summing lines may be dynamically altered on a block-by-block basis with each local summing current selectively contributing to a global summing current whose value corresponds to said Hamming distance.

7. The associative network of claim 6, wherein said cells comprise a plurality of floating gate devices each having a floating gate for collectively storing said weight pattern.

8. The associative network of claim 7, wherein said coupling means comprises a plurality of coupling devices, each of which comprises a current mirror having a first line coupled to said one of said global column lines and a second line coupled to an associated one of said local column lines such that current flow through said local column lines may selectively contribute to the current flowing in said global column lines.

9. The associative network of claim 7, wherein each of said coupling devices comprises first and second field-effect transistors each having their gates coupled together, said first transistor being coupled to one of said global column lines and said second transistor being coupled to said associated one of said local column lines and to its gate so as to form a current mirror wherein the current flow through said first transistor is a dependent function of the current flow in said second transistor.

10. The associative network according to claim 9 or 8, wherein said coupling means permits selectively computing said match within a single block of said network while ignoring all other blocks.

11. The associative network according to claim 10, wherein each of said coupling devices comprises a third field-effect transistor coupled in series between said second transistor and one of said local column lines, said control means further comprising a reference potential coupled to the gate of said third transistor such that when said reference potential is applied to each of said coupling devices within said block, said block is activated for purposes of computing said match.

12. The associative network of claim 11, wherein each of said coupling devices further comprises a fourth field-effect transistor coupled in series between said first field-effect transistor and said one of said global column lines, said fourth field-effect transistor coupling said current mirror to one of said global column lines, the gate of said fourth transistor being coupled to said control means.

13. The associative network of claim 12, wherein said first and said second transistors are p-channel devices.

14. The associative network of claim 13, wherein said third and fourth field-effect transistors are n-channel devices.

* * * * *